United States Patent
Mizushima et al.

[11] Patent Number: 6,144,546
[45] Date of Patent: Nov. 7, 2000

[54] CAPACITOR HAVING ELECTRODES WITH TWO-DIMENSIONAL CONDUCTIVITY

[75] Inventors: Koichi Mizushima; Rie Sato, both of Kanagawa-ken, Japan

[73] Assignee: Kabushiki Kaisha Toshiba, Kawasaki, Japan

[21] Appl. No.: 08/997,537

[22] Filed: Dec. 23, 1997

[30] Foreign Application Priority Data

Dec. 26, 1996 [JP] Japan ............................ 8-348958

[51] Int. Cl.$^7$ ...................................... H01G 4/00
[52] U.S. Cl. .................. 361/303; 361/301.2; 361/301.4; 361/311
[58] Field of Search .................... 361/303, 305, 361/311, 321.1, 321.4, 313, 312, 320; 257/68, 71, 908

[56] References Cited

U.S. PATENT DOCUMENTS

| | | | |
|---|---|---|---|
| 3,787,961 | 1/1974 | Tomiwa | 29/25.03 |
| 4,466,177 | 8/1984 | Chao | 438/251 |
| 4,539,660 | 9/1985 | Miyauchi et al. | 365/229 |
| 4,911,996 | 3/1990 | Holleck et al. | 429/194 |
| 4,983,538 | 1/1991 | Gotou | 437/100 |
| 5,498,890 | 3/1996 | Kim et al. | 257/310 |
| 5,554,564 | 9/1996 | Nishioka et al. | 437/192 |
| 5,650,689 | 7/1997 | Itoh et al. | 313/310 |
| 5,670,808 | 9/1997 | Nishihori et al. | 257/310 |
| 5,682,041 | 10/1997 | Kawakubo et al. | 257/38 |
| 5,737,180 | 4/1998 | Yoo | 361/313 |
| 5,774,327 | 6/1998 | Park | 361/321.5 |
| 5,790,366 | 8/1998 | Desu et al. | 361/305 |
| 5,825,609 | 10/1998 | Andricacos et al. | 361/321.4 |
| 5,838,530 | 11/1998 | Zhang | 361/321.4 |

OTHER PUBLICATIONS

Radel et al., Chemistry, p. 769, 1990.
Lewis, Sr; Hawley's Condensed Chemical Dictionary, p. 803, 1997.
S. Yamamichi, et al., "An ECR MOCVD (Ba,Sr) TiO$_3$ Based Stacked Capacitor Technology with RuO$_2$/Ru/TiN/TiSi$_x$ Storage Nodes for Gbit–Scale DRAMs", IEEE IEDM Tech. Digest, 1995, pp. 119–122.

*Primary Examiner*—Dean A. Reichard
*Assistant Examiner*—Eric Thomas
*Attorney, Agent, or Firm*—Oblon, Spivak, McClelland, Maier & Neustadt, P.C.

[57] ABSTRACT

A capacitor having a small leakage current comprises first and second electrodes and a dielectric. At least one of the electrodes may be formed of a laminar two-dimensional semimetal, a laminar two-dimensional semiconductor, a very thin metal film, or a very thin semimetal film. Alternatively, at least one of the electrodes may be a laminate film comprising laminated layers of a very thin semimetal or metal film and a very thin semiconductor film. One example of such a capacitor is a thin hexagonal boron nitride BN film sandwiched between two graphite films.

22 Claims, 6 Drawing Sheets

FIG. 11

CAPACITOR HAVING ELECTRODES WITH TWO-DIMENSIONAL CONDUCTIVITY

BACKGROUND OF THE INVENTION

1. Field of the Invention

The present invention relates to a capacitor, and more particularly, to a capacitor used in a semiconductor memory such as dynamic random access memory (DRAM), static random access memory (SRAM), and ferroelectric random access memory (FR).

2. Description of Related Art

Recently, many important parts of computers and communication equipment typically use a large-scale integrated (LSI) circuit having many transistors and resistors that are connected to achieve an electric circuit integrated on one chip. For this reason, the performance of the entire equipment is largely related to the performance of the LSI circuit. The performance of the LSI element can be improved by increasing the degree of integration.

In particular, since DRAM was introduced as a charge-storage solid state memory with a simple structure and manufacturing method in 1970, it has been widely used after increasing its degree of integration. In particular, since 1972, DRAM that includes one memory cell consisting of one capacitor (condenser) and one transistor is used widely due to its simple structure and small size.

In the DRAM, a capacitor comprises a thin dielectric film, such as a $SiO_2$ system thin film, sandwiched between electrodes, and also stores signal charges. The transistor is used as a switch for identifying and designating the capacitor.

Although the chip area is also slowly increased with the increase in the degree of integration of the DRAM, one memory cell area is decreased at a rate higher than that. Here, the problem is that even if the area of the memory cell is decreased, the electrostatic capacity of the capacitor in the memory cell must be maintained at 30 fF or more in terms of sensitivity of a sense amplifier, the electrostatic capacity of bit lines, and a radiation-resistant soft error.

In order to achieve the correct electrostatic capacity, a first method for thinning a capacitor insulating film (thin dielectric film), a second method for increasing the effective area of the capacitor by making the capacitor structure three dimensional a third method using a dielectric material with a large permittivity, and so forth, are performed. Among these methods, the first and second methods have been mainly adopted until recently.

However, in the first method, the thickness of a $SiO_2$ film is as thin as 5 nm, and similarly, the thickness of a $SiO_2/Si_3N_4/SiO_2$ film, which is a thin dielectric film with a sandwich structure is also as thin as 5 nm. Thus, the leakage current is increased by a tunnel effect, which is problematic.

In the second method, since the three dimensional structure is formed, the process is complicated, so that the number of processes and the step difference are increased. Thereby, the yield is lowered.

In the third method, a high dielectric oxide such as $Ta_2O_5$, $Y_2O_3$, or $SrTiO_3$ is used as a high dielectric material; however, since the forbidden band gap is necessarily narrow (3–4 eV) in these high dielectric oxides, the leakage current is also increased.

As mentioned above, along with the degree of integration of the DRAM, the miniaturization of the capacitor for storing signal charges is also in progress. As a result, while the electrostatic capacity of the capacitor is decreased, it is difficult to secure the required electrostatic capacity.

Accordingly, in order to secure the electrostatic capacity, several methods such as thinning of the capacitor insulating film, forming a three dimensional capacitor structure, and adoption of a high-dielectric material were proposed; however, in doing so, the leakage current was increased, or the yield was lowered.

SUMMARY OF THE INVENTION

Accordingly, the object of the present invention is to provide a capacitor with little leakage current, even if the miniaturization is advanced.

Accordingly, the present invention provides a capacitor comprising first and second electrodes and a dielectric film sandwiched between the first and second electrodes. At least one of the first and second electrodes may be formed of a laminar two-dimensional metalloid, or a laminar two-dimensional semiconductor.

Also, the present invention provides a capacitor comprising first and second electrodes and a dielectric film sandwiched between the first and second electrodes. At least one of the first and second electrodes is formed of a very thin metal film, a very thin metalloid film, or a very thin semiconductor film.

Also, the present invention provides the above-mentioned capacitor in which the carrier density of the above-mentioned laminar two-dimensional semiconductor is $1 \times 10^{20}$ to $1 \times 10^{21}$ $cm^3$.

Also, the present invention provides a capacitor comprising first and second electrodes and a dielectric film sandwiched between the first and second electrodes. At least one of the first and second electrodes is a laminate film in which a very thin metal film and a very thin insulator film are laminated in an alternating fashion.

Alternatively, at least one of the first and second electrodes is a laminate film in which a very thin metalloid film and a very thin insulator film are laminated in an alternating fashion.

Also, the present invention provides a capacitor comprising first and second electrodes and a dielectric film sandwiched between first and second electrodes. At least one of the first and second electrodes is a laminate film in which a very thin metal film and a very thin semiconductor film are laminated in an alternating fashion. Alternatively, at least one of the first and second electrodes is a laminate film in which a very thin metalloid film and a very thin semiconductor film are laminated in an alternating fashion.

Also, the present invention provides the above-mentioned capacitors wherein the above-mentioned dielectric film is a laminar two-dimensional dielectric film.

Also, the present invention uses a transition metal chalcogen compound such as $TiS_2$ or semimetal such as graphite as the above-mentioned laminar two-dimensional metalloid.

Also, the present invention uses laminar B—C—N compounds such as $BC_2N$, or laminar two-dimensional oxides whose crystal structure is an $NaFeO_2$-type and composition is $Li_xMO_2$ or $Li_xM_{2-x}O_2$ (M=V, Cr, Mn, Fe, Co, and Ni). The present invention may also use substances in which a copper oxide with a laminar perovskite-type structure such as a bismuth system superconductor and lead system superconductor (specifically, a copper oxide with a perovskite-type structure having at least one or more $CuO_2$ layers) is changed to a semiconductor by introducing an oxygen defect or substituting a metal element, as the laminar two-dimensional semiconductor.

Also, the present invention uses a hexagonal boron nitride as the laminar two-dimensional dielectric film.

One feature of the present invention is in that a conductor with a strong two-dimensional characteristic having a laminar structure, in particular, semimetal (laminar two-dimensional semimetal) or semiconductor (laminar two-dimensional semiconductor) instead of a metal is used as a constituting material of capacitor electrodes so that the leakage current of the capacitor can be held at a small value, even if a thin dielectric film is used.

In the laminar two-dimensional metal or laminar two-dimensional semiconductor, electric charges exhibit a two-dimensional conduction along the layer. Therefore, the leakage current can be suppressed by forming electrodes so that the layer is formed nearly parallel with the dielectric film.

Also, a feature of the present invention is such that very thin metal films, very thin semimetal films, or very thin semiconductor films are used as a constituting material of the capacitor electrodes. Very thin film means a film which has a structure in which the film interface is sandwiched between barriers, and shows a two-dimensional conduction in the plane direction by a quantum confinement effect of electric charges. Typically, the thickness of the very thin film is in a range of 0.5–5 nm.

In the very thin metal film and the very thin semimetal film, since electric charges exhibit a two-dimensional conduction in the plane direction, the leakage current can be suppressed by forming electrodes for the dielectric film. Also, at that time, barrier materials, for example, very thin metal films and very thin semimetal films, very thin insulator films and very thin semiconductor films, and the like, may also be laminated in an alternating fashion.

Also, the present invention can use a dielectric (laminar two-dimensional dielectric) with a laminar two-dimensional structure, and the breakdown voltage of the capacitor can be raised, even by using a thinner dielectric film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Next, the capacitors and the operation of the present invention are explained in detail. First, the main mechanisms of the leakage current of a capacitor using a thin dielectric film is explained. The main mechanisms include the five mechanisms shown in FIGS. 5a–5e.

Figure 5A:
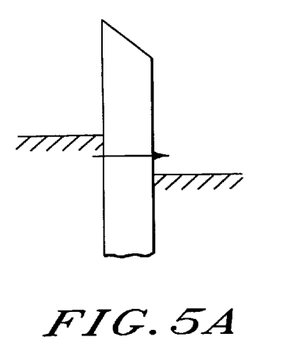
FIGS. 5a–5e are band diagrams showing the leakage current mechanism of capacitors.
Figure 5B:
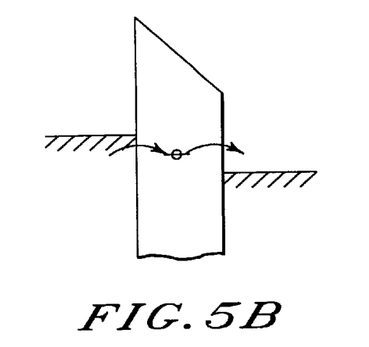

FIG. 5a is a band diagram showing a leakage current of a direct tunnel current. The arrows in FIGS. 5a to 5e indicate the leakage current. Also, FIG. 5b is a band diagram showing a leakage current of a tunnel current via an impurity level. These leakage currents are not negligible when the thickness of the thin dielectric film of the capacitor is several nanometers or less.

Figure 5C:
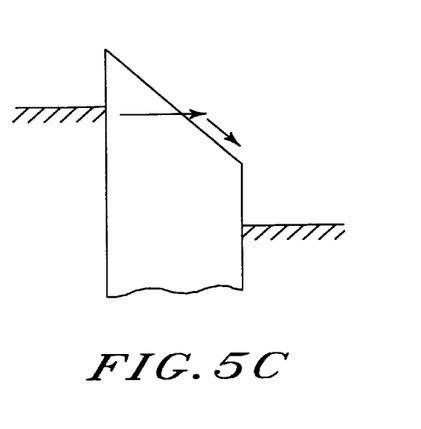

FIG. 5c is a band diagram showing a leakage current caused by a Fowler Nodheim-type (FN-type) tunnel current. The leakage current becomes particularly significant when the forbidden band gap of the dielectric film is small.

Figure 5D:
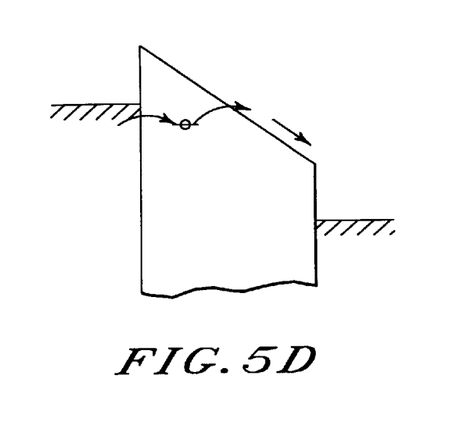

FIG. 5d is a band diagram showing a leakage current of a FN-type tunnel current via an impurity (defect) level. The leakage current is not negligible for a thin dielectric film, whose forbidden band gap is narrow, and contains many defects. Such a current is like a transition metal oxide current.

Figure 5E:
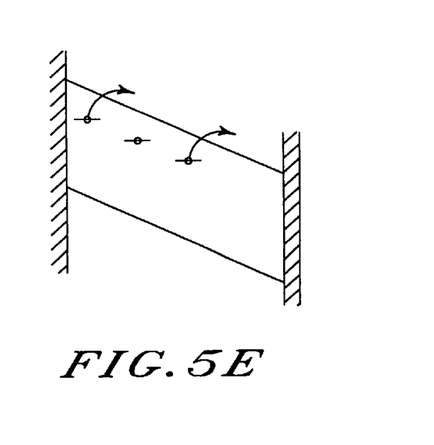

FIG. 5e is a band diagram showing a leakage current of a Poole-Frenkel type conduction mechanism. The leakage current becomes distinct in a thin dielectric film with a narrow forbidden band gap such that a shallow impurity level is apt to be generated. However, the leakage current can be greatly reduced by controlling the Fermi level by an oxidation-reduction treatment.

Among the above-mentioned leakage currents, the leakage currents of FIGS. 5a–5d except for FIG. 5e are related to electrodes as well as the thin dielectric film. Therefore, in the present invention, even when the same thin dielectric film is used, the leakage current can be reduced by selecting an appropriate electrode.

Figure 6:
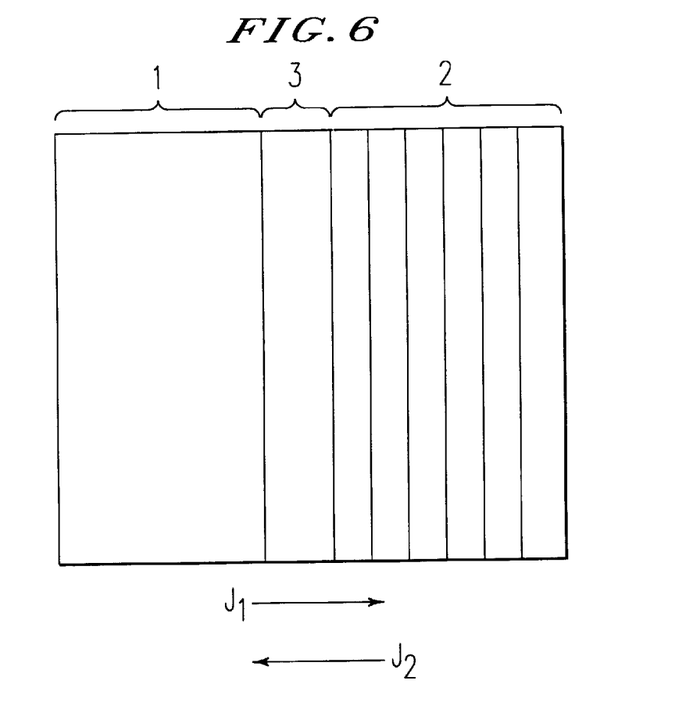
FIG. 6 is a cross sectional view of a capacitor according to a fifth embodiment of the present invention.

FIG. 6 is a cross sectional view of a capacitor according to an embodiment of the present invention. Here, the case where the leakage current of the direct tunnel current of FIG. 5a is prevented is explained. The capacitor comprises a first electrode 1, a second electrode 2, and a thin dielectric film 3. The thin dielectric film 3 is sandwiched between the first electrode 1 and the second electrode 2 as shown in FIG. 6.

As shown in FIG. 6, the thin dielectric film 3 is formed on the first electrode 1, which is composed of a metal showing a three-dimensional conduction. The second electrode 2 is formed on the thin dielectric film 3, and may be formed of a laminar two-dimensional semimetal or laminar two-dimensional semiconductor. Here, the plane in the second electrode 2 having the two-dimensional conduction is formed nearly parallel with the thin dielectric film 3.

In one embodiment of the present invention, the second electrode 2 may be formed of graphite, which is a laminar two-dimensional semimetal. The atomic layer of the graphite is formed so that it is arranged nearly parallel with the dielectric film 3. In one embodiment of the present invention, the atomic layer is formed nearly parallel with the dielectric film 3 by an epitaxial film which is gas phase-deposited by MOCVD (metal-organic chemical vapor deposition).

In the graphite, conductive electrons in the vicinity of the Fermi level are confined in the atomic layer and are in motion at a velocity in the direction parallel with the atomic layer. The state of the electrons, which can be in motion in the direction perpendicular to the atomic layer, (interlayer band) is an electron state with a high energy of about 4 eV or more. For this reason, in the graphite, the conductive electrons have a strong two-dimensional characteristic which cannot be in motion in the direction perpendicular to the atomic layer but can be in motion in the direction parallel to the atomic layer.

It can be understood from the following that the tunnel current flowing to a junction shown in FIG. 6 is small.

When the applied voltage V=0, the current $J_1$ flowing from the first electrode 1 to the second electrode 2 is as follows:

$$J_1 = e \int v_x n_1(v_x) D_{12}(E_x) dv_x = (4\pi m^2/h^3) D_{12}(E_x) dE_x \int f(E) dE_t \quad (1)$$

On the other hand, the current $J_2$ flowing from the second electrode 2 to the first electrode 1 is as follows.

$$J_2 = e \int v_x n_2(v_x) D_{21}(E_x) dv_x \quad (2)$$

In the above-mentioned equations (1) and (2), the variable $v_x$ is a velocity in the direction (x direction) perpendicular to the junction surface of the electrons. The variables $n_1(v_x)$ and $n_2(v_x)$ are electron densities with the velocity $v_x$ at the first electrode 1 and the second electrode 2, respectively. The variables $D_{12}$ and $D_{21}$ represent the tunnel probability from the first electrode 1 to the second electrode 2 and the tunnel probability from the second electrode 2 to the first electrode 1, respectively. The values $E_x$ and $E_t$ are kinetic energy components of the electrons in the direction perpendicular to and parallel with the junction surface. The value e is the electron charge. The function f is the Fermi distribution function. The constant h is Planck's constant. The constant m is the mass of the electron.

Here, in the second electrode 2, basically, since no electron in motion in the x direction exists, the electron density $n_2(v_x)$ can be expressed using $\delta(v_x)$ (delta function). Therefore, the current $J_2=0$ is derived from equation (2)

Also, in the present invention, if the mean velocity of $v_x$ of the electrons is $v_{xMEAN}$ and the mean velocity of the other two components of the electron velocity are respectively $v_{yMEAN}$ and $v_{zMEAN}$, the laminar two-dimensional characteristic is defined as $v_{xMEAN}^{1/2} < 10(v_{yMEAN}^{1/2} + v_{MEAN}^{1/2})$. Therefore, the current $J_2$ is not necessarily a generalized function such as a delta function but may also be an ordinary function such as a Gaussion function. However, it is practically sufficiently smaller than ordinary current ($J_2'$), or expressed mathematically ($J_2 < J_2'/10$).

When the applied voltage V=0, since the total current $J = J_1 + J_2 = 0$, $J_1$ is also 0. Therefore, from the equation (1), the tunnel probability $D_{12}$ from the first electrode 1 to the second electrode 2

$$D_{12}(E_x) = 0 \quad (3)$$

is obtained.

Even when the applied voltage V≠0, since the electron density $n_2(v_x)$ is expressed using a delta function $\delta(v_x)$ in the second electrode 2, the current $J_2=0$.

On the other hand, the current $J_1$ is $$J_1 = (4\pi m^2/h^3) \int D_{12}*(E_x) dE_x \int f(E+eV) dE_t \quad (4)$$

Where, $D_{12}*$ shows a tunnel probability of electrons from the first electrode 1 to the second electrode 2 when the applied voltage V≠0; however, since the tunnel probability $D_{12}*$ is approximately equal to the tunnel probability $D_{12}$ (=0) in a linear approximation, the current $J_2$ is approximately 0.

As shown in the above results, the tunnel current seldom flows, and the leakage current seldom flows, even if the miniaturization of the capacitor is increased.

Here, in the direct tunnel current of FIG. 5a, the operation of the present invention is explained; however, a similar discussion is also applied to the case of the tunnel current and the FN type tunnel current via the impurity level as shown in FIGS. 5b–5d. The leakage current can be reduced by forming at least one of the first and second electrodes 1 and 2, respectively, of semimetal or semiconductor having a laminar two-dimensional characteristic. Of course, if both the first and second electrodes are formed of the laminar two-dimensional semimetal or semiconductor, the leakage current is further reduced.

Furthermore, as seen from the equation (1), it is understood that the leakage current from the tunnel current can be reduced by reducing the electron density n and the electron velocity v in the electrodes 1 and 2.

In other words, the leakage current can be further reduced by at least an order of magnitude by using the two-dimensional semimetal with an electron density n of $10^{21} cm^{-3}$ or less and a Fermi velocity $v_F$ of $10^7$ cm/sec or less according to the present invention, instead of an ordinary metal with an electron density n of about $10^{22} cm^{-3}$ and a Fermi velocity $v_F$ of the electrons of about $10^8$ cm/sec.

Similar effects are also expected in the case where a semiconductor with a carrier density of $10^{21} cm^{-3}$ or less is used. However, in the case of the semiconductor, if the carrier density (dopant density) is small, since a thick depletion layer is formed at the interface and the apparent permittivity is lowered, the carrier density is preferably $10^{20} cm^{-3}$ or more. From the above fact, the carrier density of the laminar two-dimensional semiconductor is preferably $10^{20}$ to $10^{21} cm^{-3}$.

In one embodiment of the present invention, the graphite can be formed on the dielectric layer at the atomic layer unit by an ultrahigh vacuum CVD method, and also may be used as an electrode. The graphite electrode, which is a semimetal in which the atomic layer is arranged nearly parallel with the dielectric, can be formed by the thin-film deposition.

As mentioned above, the conductive electrons close to the Fermi level in the graphite move in a plane c parallel with the atomic layer, and the electrons that move in a c axis direction perpendicular to the atomic layer have an energy state 4 eV higher than the Fermi level. Thus, the graphite is a metal in the atomic layer, an insulator in the direction perpendicular to the atomic layer, and a nearly ideal two-dimensional conductor.

Also, high-temperature oxide superconductors have recently been actively researched; however, all of these superconductors are copper oxides based on the perovskite structure. In particular, they are represented by a bismuth system and a lead system. It is understood that the superconductor having a laminar perovskite structure is a metal with a strong two-dimensional characteristic. The laminar perovskite oxide is easily changed to a semiconductor by reducing trivalent copper ions by introducing an oxygen defect or substituting a metal element. The laminar two-dimensional semiconductor formed in this manner can be used as a capacitor electrode.

Also, these substances can be easily epitaxially deposited on a perovskite-type dielectric substrate such as strontium titanate. Therefore, the above-mentioned superconductor, which is changed to a semiconductor, can be used as an electrode of the capacitor on a dielectric composed of a perovskite-type oxide film. Such a capacitor may be used in a semiconductor memory such as DRAM and FRAM.

Also, it is desirable to form a thin dielectric film with a high breakdown voltage in order to form a favorable capacitor. A thin hexagonal boron nitride film formed by the ultrahigh vacuum CVD method exhibits a very high breakdown voltage. The thin hexagonal boron nitride film has almost the same crystal structure and lattice constant as the graphite. Therefore, a dielectric composed of the thin hexagonal boron nitride film and the capacitor composed of the graphite electrode formed on the dielectric are especially useful. Thus, a small-scale capacitor with a lower leakage current and a high breakdown voltage can be provided by arranging the two-dimensional plane of the electrode and the two-dimensional plane of the thin dielectric film nearly in parallel.

As other laminar two-dimensional semimetals having a strong two-dimensional characteristic, laminar oxides having a $NaFeO_2$ type crystal structure and a composition of $Li_xMO_2$ or $Li_xM_{2-x}O_2$.

(wherein x is chosen so as to obtain a semimetal, for example $0.2<x<1.0$ and M=V, Cr, Mn, Fe, Co, or Ni), transition metal chalcogens such as $TiS_2$, and the like, are known.

Also, in the capacitor shown in FIG. 6, very thin metal films, very thin semimetal films, and very thin semiconductor films with a strong two-dimensional characteristic can be used as the second electrode 2. For example, the reduction of the leakage current can be expected by forming an electrode with a thickness of a monoatomic layer to 5 nm or less and having a strong two-dimensional characteristic using Al, Cu, or the like as a metal. The very thin semimetal film and the very thin semiconductor film are also similar.

Figure 7:
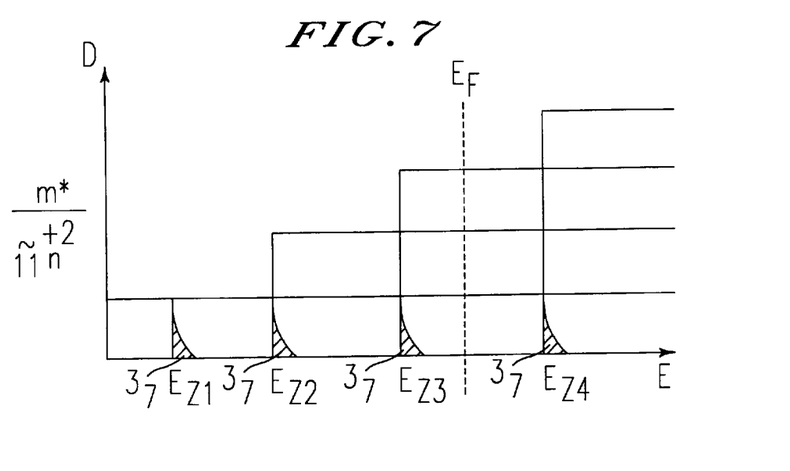
FIG. 7 is a band diagram showing a state density of quantized electrons in the electrodes of the present invention.
Figure 8:
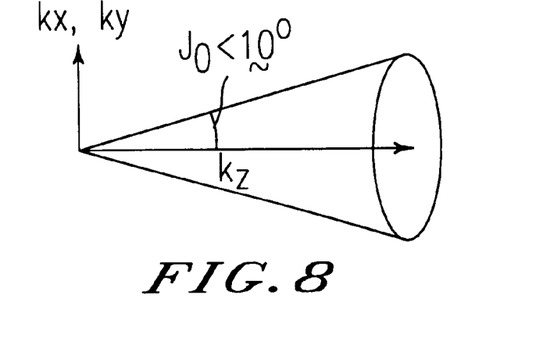
FIG. 8 is a view showing a wave number vector of electrons tunneling an insulating film.

FIG. 7 is a band diagram showing a state density of quantized electrons in the electrodes according to the present invention. FIG. 8 is a view showing a wave number vector of electrons tunneling an insulation film. The x and y axes of FIG. 7 show energy of tunneling electrons, and state density, respectively. The motion of the electrons in the film thickness direction (Z direction) is quantized at an energy gap of several hundred meV or more, and the energy E is as follows.

$$E=(h^2/8m\pi^2)(k_x^2+k_y^2)+E_{zn}$$

$$E_{zn}=(h^2/8m\pi^2)(n\pi/l)^2$$

$$\Delta E_n \approx (1/36)E_{zn} \approx 150 \text{ meV} \quad (5)$$

The state density is stepwise as shown in FIG. 7. Where the constant h is Planck's constant, the value m is an effective mass of electrons, the number n is a positive integer, and the variable l is the film thickness, and $\Delta E_n$ is the difference in energy between bands. Also, the values $k_x$ and $k_y$ are wave numbers of electrons in the respective x and y directions, and $E_{zn}$ is an energy quantized in the Z direction.

On the other hand, the angle dependency of the tunnel current J$\theta$ is $$J\theta \approx \exp(-\beta^2 \sin^2 \theta) \quad (6)$$

However, if $\beta^4=2ms^2E_F 2/h^2(E_v-E)$ is considered, it is seen that the wave number vector of the electrons tunneling the insulating film is nearly perpendicular ($\theta$ is nearly equal to 10°) to the junction surface as shown in FIG. 8, and that only the electrons of the curved portion 37 in the state of FIG. 7 contribute to the tunnel current.

The energy width of the curved portion 37 is about 100 meV, and when the thickness l of the very thin film is 4 nm, if the Fermi energy $E_F$ is about 5 eV, the energy gap of the curved portion 37 close to $E_F$ is about 0.8 eV. In other words, the electrons in the very thin film behave like the electrons in the insulator in the tunnel junction and do not contribute to the tunnel current.

However, if only the very thin film is used, since the film thickness is too thin, the sheet resistance of the electrode is increased. Accordingly, a capacitor shown in FIG. 9 is considered.

Figure 9:
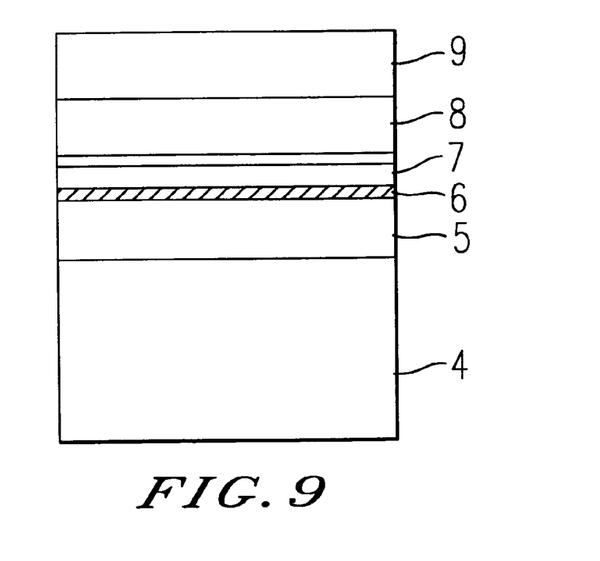
FIG. 9 is a cross sectional view showing a capacitor according to a sixth embodiment of the present invention.

FIG. 9 is a cross sectional view showing a capacitor according to another embodiment of the present invention. On a substrate 4, a backing layer 5, a barrier layer 6, a very thin film 7, a dielectric layer 8, and an electrode 9 are sequentially formed. The barrier layer 6 acts as a barrier of the very thin film 7 so that electrons are two-dimensionally confined in the film 7. The barrier layer 6 is sufficiently thin, compared with the tunnel insulating film. Also, the role of the barrier layer 6 reflects the electrons in the very thin film 7. The backing layer 5 is formed thick (100–1000 nm) to reduce the sheet resistance of the electrode. Thus, electric charges can be sufficiently provided to the electrode.

Figure 10:
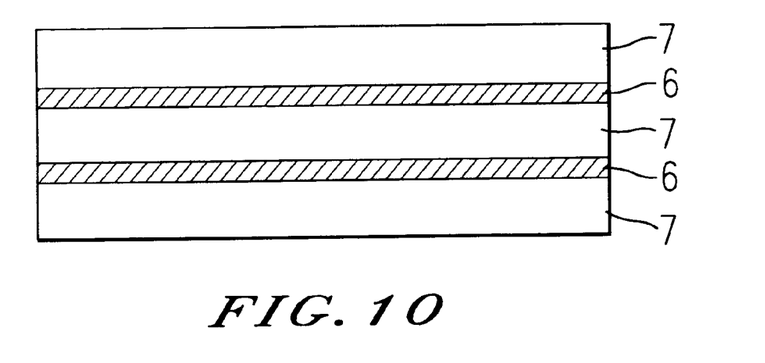
FIG. 10 is a cross sectional view showing a capacitor according to a seventh embodiment of the present invention.

FIG. 10 is a cross sectional view showing a capacitor according to yet another embodiment of the present invention. Also, instead of the laminate structure of the very thin film 7 and the barrier layer 6 of FIG. 9, several very thin films 7 and barrier layers 6 may also be laminated in an alternating fashion as the capacitor electrode as shown in FIG. 10. In this case, it is also necessary for the thickness of the barrier layer 6 to be sufficiently thin, compared with the tunnel insulating film.

Also, in the structures of FIGS. 9 and 10, the leakage current is also further reduced by forming the very thin film 7 of a semimetal, such as graphite, bismuth, and antimony. Also, the very thin film 7 may be formed of a very thin semiconductor having a carrier density of $10^{20}$ to $10^{21}/cm^3$.

Next, referring to FIGS. 1–4, application examples of the present invention are described.

Figure 1:
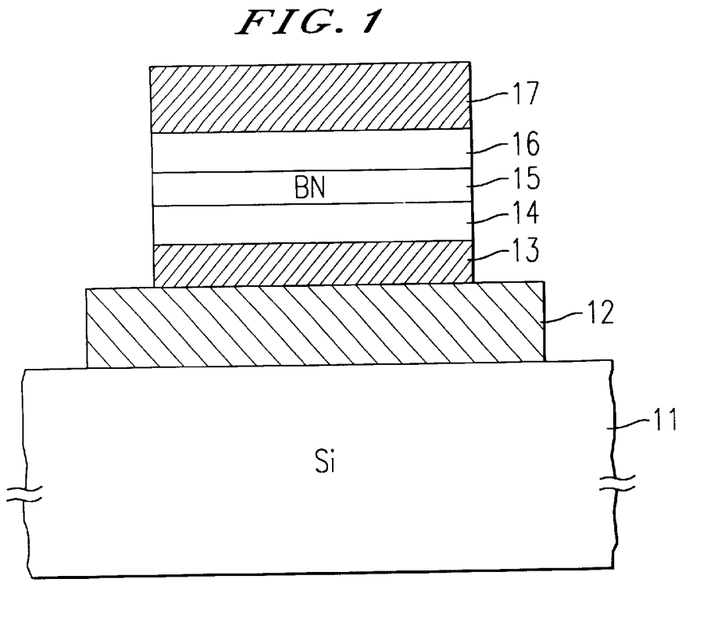
FIG. 1 is a cross sectional view showing a capacitor according to a first embodiment of the present invention.

FIG. 1 is a cross sectional view showing the capacitor of one embodiment of the present invention.

The capacitor is explained according to the manufacturing process. First, a reaction-inhibiting film and a NbN film 12 formed as a first lower electrode are formed on a Si substrate 11 having a principal plane of (100), wherein (100) corresponds to the usual Miller indices notation used to identify atomic crystal planes. The NbN film 12 is formed using a reactive sputtering method. Specifically, the formation is as follows.

First, a Nb sputtering target is used, and the substrate temperature is set to a prescribed value in a range of 473–673° K. Next, $N_2$ gas and Ar gas are respectively introduced at 5 mtorr, and the input DC power is set to about 50–100 W. The NbN film 12 is formed, at a film-formation rate of 0.50–1 mm/sec, to a thickness of 100 nm.

Also, instead of $N_2$ gas, a NbN sputtering target may be used as a N raw material. Alternatively, both $N_2$ gas and NbN may be used.

When the interface of the NbN film 12 and the Si substrate 11 formed in this manner was observed by sectional TEM (transmission electron microscopy) and EDX (Energy Dispersive X-ray analysis system), it was confirmed that no Si diffusion was seen at the interface of the NbN film 12 and the Si substrate 11 and that a steep interface was formed.

Next, the Si substrate 11 is introduced into an ultrahigh vacuum chamber (not shown) of $1 \times 10^{-10}$ torr, and a Ni film 13 with a thickness of 300 nm is vapor-deposited as a second lower capacitor electrode. At that time, since the NbN film 12 acts as a reaction-inhibiting film, the Ni film 13 does not react with the Si substrate 11. The Ni film 13 is formed so that the growth of the graphite, which is a laminar two-dimensional semimetal as a constituting material of a third lower capacitor electrode, is made easier.

Next, after the temperature of the Si substrate 11 is raised to 650° C., $C_3H_8$ gas of 1 mtorr is introduced into the above-mentioned ultrahigh vacuum chamber, and a graphite film 14 having a thickness of 20 nm is formed as a third lower capacitor electrode, which is a laminar two-dimensional semimetal on the Ni film 12.

Next, the introduction of $C_3H_8$ gas is stopped, and the degree of vacuum is raised to $1 \times 10^{-8}$ torr. The substrate temperature is raised to 700° C. Then, a diborane gas is introduced at 1 mtorr, and a thin hexagonal boron nitride BN film 15 (a laminar two-dimensional dielectric) having a thickness of 3 nm is formed as a thin capacitor dielectric film on the graphite film 14 by a CVD method. With such an ultrahigh vacuum CVD method, a thin hexagonal boron nitride BN film 15 with a high breakdown voltage can be realized.

Next, the degree of vacuum is raised again up to $1 \times 10^{-8}$ torr, and the substrate temperature is set to 650° C. Then, $C_3H_8$ gas is introduced, and a graphite film 16 (laminar two-dimensional semimetal) having a thickness of 10 nm is formed as a first upper capacitor electrode on the thin hexagonal boron nitride BN film 15. Then, an Au film 17 is vapor-deposited as a second upper capacitor electrode on the graphite film 16.

Finally, using lithography and an Ar ion-milling device, a capacitor is completed on the Si substrate 11 by processing the laminate films 12–17, as shown in FIG. 1.

When the capacitor obtained in this manner was evaluated by a capacitance measurement, the relative permittivity of the thin hexagonal boron nitride BN film 15 was 5. Also, when a voltage of 2 V was applied, the leakage current was less than $1 \times 10^{-p}$ A/cm$^2$.

A semiconductor memory with a high degree of integration can be easily realized by using such a capacitor having small leakage current as a capacitor for storing signal charges of a semiconductor memory, such as DRAM and FRAM.

Also, the capacitor of this example can be applied to various fields in addition to the semiconductor memories such as DRAM and FRAM. For example, a capacitor that enables a high-speed charge and discharge may be used for storing power in a system in which the capacity of the capacitor is matched with a chemical cell.

A comparative example is now described. Using a method similar to the embodiment of FIG. 1, a NbN film is formed on a Si substrate, and a Ni film with a thickness of 300 nm is vapor-deposited on the NbN film. Next, the substrate temperature is raised to 700° C., and a diborane gas is introduced at 1 mtorr. A thin hexagonal boron nitride BN film with a thickness of 3 nm is formed as a thin capacitor dielectric film on a thin Ni film. Next, the substrate temperature is returned to room temperature, and a Ni film with a thickness of 100 nm is formed on the thin hexagonal boron nitride BN film. Finally, a capacitor with a NbN/Ni/BN/Ni structure (three-dimensional metal/laminar two-dimensional dielectric/three-dimensional metal) is completed by processing the above-mentioned three layer films by a method similar to the embodiment of FIG. 1.

The relative permittivity of the BN attained from the capacitance measurement of the capacitor was 5 similar to that of the first application example; however, the leakage current was large. When a voltage of 1 V was applied, the leakage current was as large as $1 \times 10^{-6}$ A/cm$^2$ or more.

Figure 2:
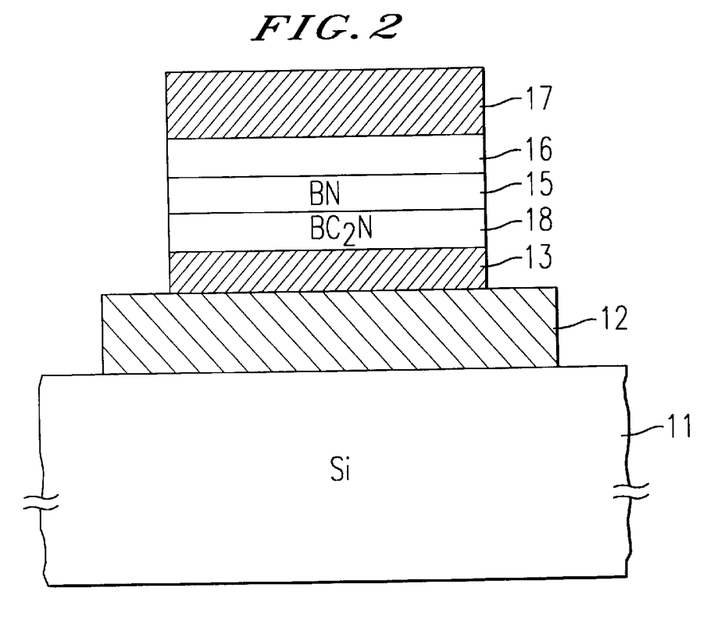
FIG. 2 is a cross sectional view showing a capacitor according to a second embodiment of the present invention.

FIG. 2 is a cross sectional view showing the capacitor of another embodiment of the present invention. Also, the same symbol as that of FIG. 1 is given to a part corresponding to the capacitor of FIG. 1.

First, the NbN film 12 is formed as a first lower capacitor electrode on the Si substrate 11 by a method similar to the embodiment of FIG. 1. Next, the Ni film 13 is vapor-deposited as a second lower capacitor electrode with a thickness of 300 nm on the NbN film 12.

Next, the substrate temperature is raised to 600° C., and $BC_3$ gas and $CH_3CN$ gas are respectively introduced at 1 mtorr. A hexagonal $BC_2N$ compound film 18 having a thickness of 100 nm of a laminar compound is formed as a third lower capacitor electrode on the Ni film 13. The hexagonal $BC_2N$ compound film 18 formed by such a method is a laminar two-dimensional P-type semiconductor having a band gap of 2 eV and a carrier density of about $10^{20}$ cm$^{-3}$ due to a nitrogen defect.

Next, the introduction of $BCl_3$ gas and $CH_3CN$ gas is stopped, and the degree of vacuum is raised to $1 \times 10^{-8}$ torr. The substrate temperature is raised to 700° C. Next, a diborane gas is introduced at 1 mtorr, and the thin hexagonal boron nitride BN film 15 (a laminar two-dimensional dielectric) having a thickness of 3 nm is formed on the hexagonal $BC_2N$ compound film 18.

Next, the degree of vacuum is set again at $1 \times 10^{-8}$ torr, and the substrate temperature is set to 650° C. Then, $C_3H_8$ gas is introduced, and the graphite film 16 (laminar two-dimensional semimetal) having a thickness of 10 nm is formed on the thin hexagonal BN film 15. Thereafter, the process is similar to that of the embodiment of FIG. 1 for forming the Au film 17 and completing the capacitor.

When the capacitor obtained in this manner was evaluated by the capacitance measurement, the relative permittivity of the thin hexagonal boron nitride BN film 15 was 5. Also, when a voltage of 2 V was applied, the leakage current was less than $1 \times 10^{-9}$ A/cm$^2$. Therefore, effects similar to those of the embodiment of FIG. 1 are also obtained. Also, it was seen that no barrier layer which resulted in the decrease of the permittivity was formed at the interface of the thin hexagonal boron nitride BN film 15, which is a laminar two-dimensional dielectric, and the hexagonal $BC_2N$ compound film 18, which is a laminar two-dimensional semiconductor. This is because the lattice coherence of the thin hexagonal boron nitride BN film 15 and the hexagonal $BC_2N$ compound film 18 is very good.

Figure 3:
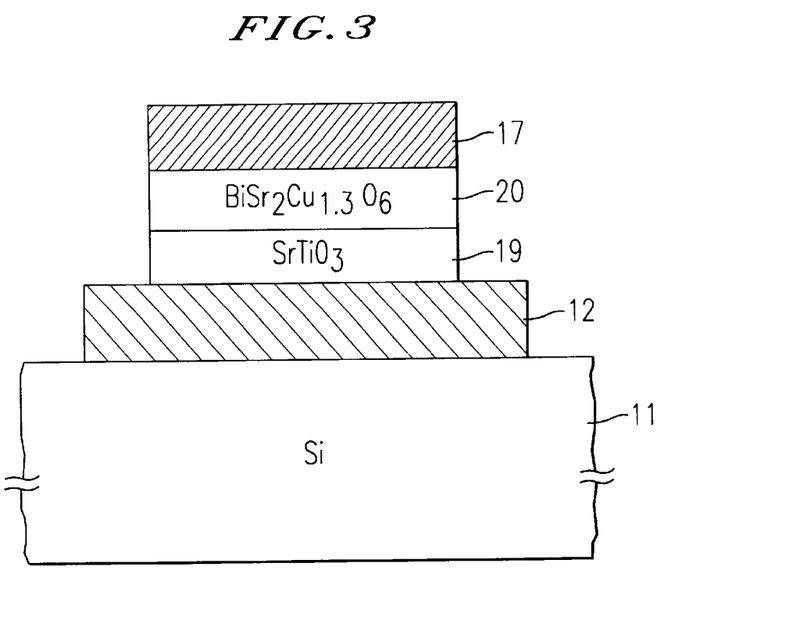
FIG. 3 is a cross sectional view showing a capacitor according to a third embodiment of the present invention.

FIG. 3 is a cross sectional view showing the capacitor according to still another embodiment of the present invention. Also, the same symbol as that of FIG. 1 is given to the part corresponding to the capacitor of FIG. 1.

The embodiment of FIG. 3 is an example in which a BiSrCuO oxide (laminar perovskite structure type) of a bismuth system superconductor (2212) phase (which is one of the laminar two-dimensional semiconductors) is changed to a semiconductor and used as a material of a second upper capacitor electrode 20. The expression "a bismuth system superconductor (2212) phase" corresponds to the usual notation defining for example $Bi_2Sr_2Ca_1Cu_2O_8$.

The capacitor is explained according to the manufacturing process. First, a reaction-inhibiting film and the NbN film 12 as a lower capacitor electrode are formed on the Si substrate 11 and have a principal plane of (100). A thin $SrTiO_3$ film 19 is formed as a thin capacitor dielectric film on the NbN film 12. The NbN film 12 and the thin $SrTiO_3$ film 19 are formed by a reactive sputtering method. Specifically, the formation is as follows.

Here, a Nb sputtering target, a SrO sputtering target, and a Ti sputtering target are used. First, the Nb sputtering target is used, and the substrate temperature is set to a prescribed value in a range of 473–673 K. Next, $N_2$ gas and Ar gas are respectively introduced at 5 mtorr, and the input DC power is set to about 50–100 W. The NbN film 12 having a thickness of 100 nm is formed at a film-formation rate of 0.5–1 nm/sec.

Next, the above-mentioned three sputtering targets are independently controlled, and the substrate temperature is set to 673° K. Then, oxygen gas and argon gas are respectively introduced at 5 mtorr, and the thin $SrTiO_3$ film 19 having a thickness of 20 nm is formed at a film-formation rate of 0.1 nm/sec.

In the NbN film 12 and the thin $SrTiO_3$ film 19 formed in this manner, both the interface of the NbN film 12 and the Si substrate 11 and the interface of the thin $SrTiO_3$ film 19 and the NbN film 12 were respectively observed by the sectional TEM and EDX. As a result, no Si diffusion was seen at the interface of the NbN film 12 and the Si substrate 11, and a steep interface was formed. Also, $NbO_2$ was partially formed at the interface of the thin $SrTiO_3$ film 19 and the NbN film 12; however, since the oxide has electroconductivity, it does not have an influence on the dielectric characteristic.

Next, a $BiSr_2Cu_{1.3}O_6$ film 20 of a (2212) phase is formed as a first upper capacitor electrode on the thin $SrTiO_3$ film 19 by a MOCVD method.

Specifically, $Bi(PH)_3$, $Sr(DPM)_2$, and $Cu(DPM)_2$ are used as organic metal raw materials, and Ar is used as a carrier gas. The substrate temperature is set to 730° C., and the partial oxygen pressure is controlled to 0.01–0.5 torr, so that a $BiSr_2Cu_{1.3}O_6$ film 20 of a (2212) phase with a thickness of 100 nm is formed. Here, the deposition composition ratio of the $BiSr_2Cu_{1.3}O_6$ film 20 was measured by an ICP emission spectrum method, and the crystal structure was identified by X-ray diffraction. As a result, it was a laminar two-dimensional P-type semiconductor. When the partial oxygen pressure was 0.05 torr or less, the $BiSr_2Cu_{1.3}O_6$ film 20 exhibited a semiconductor conduction, and when the pressure was 0.03 torr, the carrier density was $8 \times 10^{20}$ $cm^{-3}$.

Finally, on the $BiSr_2Cu_{1.3}O_6$ film 20, similarly to the embodiment of FIG. 1, the Au film 17 as a second upper capacitor electrode is vapor-deposited, and the laminate films 12, 19, 20, and 17 are processed, so that a capacitor is completed.

When the capacitor obtained in this manner was evaluated by the capacitance measurement, the relative permittivity of the thin $SrTiO_3$ film 19 was 150. Also, when a voltage of 2 V was applied, the leakage current was less than $1 \times 10^{-8}$ $A/cm^2$. Therefore, effects similar to those of the embodiment of FIG. 1 are also obtained in the embodiment of FIG. 3.

Also, in the embodiment of FIG. 3, the copper oxide having a laminar perovskite-type structure of a bismuth system superconductor has been changed to a semiconductor as a laminar two-dimensional semiconductor; however, the copper oxide with a laminar perovskite-type structure of a lead system superconductor may also be changed to a semiconductor.

A comparative example is now described. Using a method similar to the embodiment of FIG. 3, a NbN film and a $SrTiO_3$ film are formed on a Si substrate. Next, an Au electrode is directly vapor-deposited on the $SrTiO_3$ film 19 without forming the BiSrCuO film, which is a laminar two-dimensional semiconductor.

The relative permittivity of the $SrTiO_3$ film attained from the capacitance measurement of the capacitor was 150, similar to that of the embodiment of FIG. 3; however, the leakage current was large. When a voltage of 2 V was applied, the leakage current was $1 \times 10^{-7}$ $A/cm^2$ or more, which is an order of magnitude larger than that of the embodiment of FIG. 3.

Figure 4:
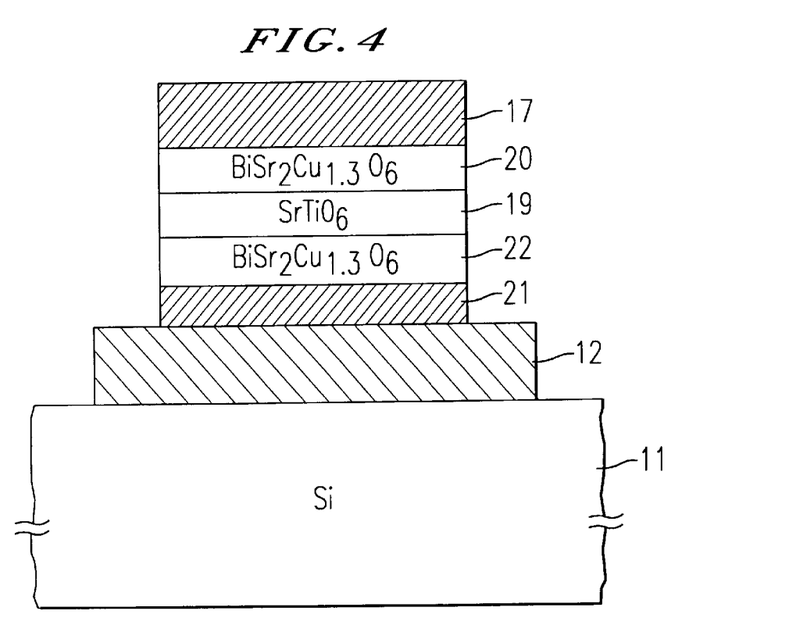
FIG. 4 is a cross sectional view showing a capacitor according to a fourth embodiment of the present invention.

FIG. 4 is a cross sectional view showing the capacitor of another embodiment of the present invention. Also, the same symbol as that of FIG. 3 is given to the part corresponding to the capacitor of FIG. 3.

The capacitor is explained according to the manufacturing process. First, similarly to the capacitor of FIG. 3, a reaction-inhibiting film and the NbN film 12 as a first lower capacitor electrode are formed on the Si substrate 11.

Next, a $SrTi_{0.9}Nb_{0.1}O_3$ film 21 having a metallic conduction is formed as a second lower capacitor electrode on the NbN film 12. Specifically, the formation is as follows.

A SrO sputtering target, a Ti sputtering target, and a Nb sputtering target are used. These three sputtering targets are independently controlled, and the substrate temperature is set to 673° K. Next, oxygen gas and Ar gas are introduced at 1 mtorr and 9 mtorr, respectively, and the $SrTi_{0.9}Nb_{0.1}O_3$ film 21 having a thickness of 20 nm is formed at a film-formation rate of 0.1 nm/sec. The composition rate of Ti and Nb is controlled by power applied to the Ti target and the Nb target.

Next, a $BiSr_2Cu_{1.3}O_6$ film 22 (laminar two-dimensional semiconductor) of a (2212) phase, which is changed to a semiconductor having a thickness of 100 nm, is formed as a third lower capacitor electrode on the $SrTi_{0.9}Nb_{0.1}O_3$ film 21 by a MOCVD method in a similar manner as in the embodiment of FIG. 3.

Next, the thin $SrTiO_3$ film 19 having a thickness of 20 nm is formed as a thin capacitor dielectric film on the $BiSr_2Cu_{1.3}O_6$ film 22 by a method similar to the embodiment of FIG. 3.

Next, the $BiSr_2Cu_{1.3}O_6$ film 20 and the Au film 17 are sequentially formed on the thin $SrTiO_3$ film 19 as first and second upper electrodes, respectively. The $BiSr_2Cu_{1.3}O_6$ film 20 (laminar two-dimensional semiconductor) of a (2212) phase has a thickness of 100 nm and is changed to a semiconductor. Thereafter, the process is similar to the embodiment of FIG. 1.

When the capacitor obtained in this manner was evaluated by the capacitance measurement, the relative permittivity of the thin $SrTiO_3$ film 19 was 150. Also, when a voltage of 2 V was applied, the leakage current was less than $1 \times 10^{-9}$ $A/cm^2$. Therefore, effects similar to those of the embodiment of FIG. 1 a re also obtained in the embodiment of FIG. 4.

Figure 11:
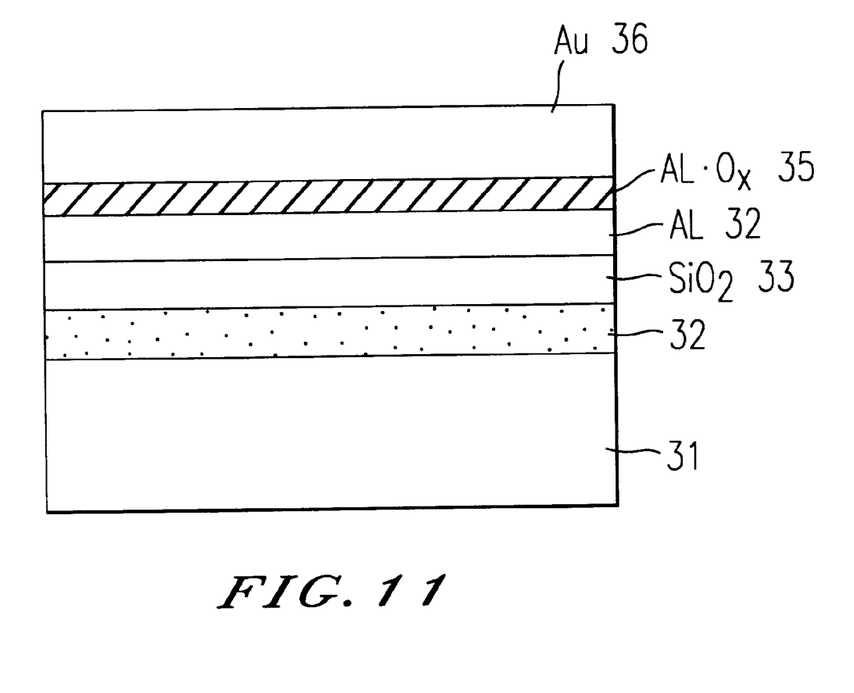
FIG. 11 is a cross sectional view showing the capacitor according to a eighth embodiment of the present invention.

FIG. 11 is a cross sectional view showing the capacitor of another embodiment of the present invention.

First, boron ions are implanted at an energy of 100 keV and a dose of $1.5 \times 10^{15}/cm^2$ on the surface of a P-type silicon (100) substrate 31. Then, the substrate is heat-treated at 800° C. for 20 min in a drying chamber atmosphere. Thus, a high-density doping (about $1.5 \times 10^{20}/cm^3$) is formed as a lower capacitor electrode 32 on the P-type silicon substrate 31.

A $SiO_2$ dielectric layer 33 having a thickness of 3 nm is formed by the CVD method ($SiH_4$—$O_2$, 300° C.) on the lower capacitor electrode 32.

Next, a very thin metal film 34 having a thickness of 2 nm is formed of Al by a vacuum deposition method. The degree of vacuum is $10^{-8}$ torr, and the substrate temperature is 77° K.

Next, the substrate is returned to room temperature, and every part of the surface of the very thin metal film 34 is oxidized by a glow discharge, so that an $AlO_x$ insulating film 35 (barrier layer) is formed at a thickness of 0.2 nm.

Finally, a Au backing layer 36 having a thickness of 100 nm is deposited to thereby form the capacitor of the present invention.

When a voltage was applied between the lower electrode 32 and the Au backing layer 36 of the capacitor and the leakage current was measured, the leakage current was lower than $1 \times 10^{-9}$ A/cm$^2$ at an applied voltage of 2 V. Therefore, effects similar to those of the embodiment of FIG. 1 are also obtained in this application example. Similar effects are also obtained by using a very thin semimetal film such as graphite, bismuth, and antimony and a very thin semiconductor film with a carrier density of $10^{20}$/cm$^3$ or more instead of the very thin metal film 34.

The present invention is not limited to the above-mentioned application examples. For example, in addition to the materials mentioned in the above-mentioned application examples, the material of the capacitor electrode may be a transition metal chalcogen compound, such as TiS$_2$, and a laminar oxide having a NaFeO$_2$-type crystal structure and a composition of Li$_x$MO$_2$ or Li$_x$M$_{2-x}$O$_2$ (M=V, Cr, Mn, Fe, Co, and Ni) may also be used. In addition, the present invention can be implemented by variously modifying it within in its technical range.

As mentioned above in detail, according to the present invention, by using a laminar two-dimensional semimetal or laminar two-dimensional semiconductor as an electrode material, a capacitor with little leakage current can be realized, even if its miniaturization is advanced.

Obviously, numerous modifications and variations of the present invention are possible in light of the above teachings. It is therefore to be understood that within the scope of the appended claims, the invention may be practiced otherwise than as specifically described herein.

What is claimed is:

1. A capacitor comprising:
first and second electrodes, and
a dielectric film between the first and second electrodes,
wherein at least one of said first and second electrodes comprises a laminar two-dimensional semiconductor comprising a material based on a bismuth system superconductor (2212) phase.

2. A capacitor comprising:
first and second electrodes, and
a dielectric film between the first and second electrodes,
wherein at least one of said first and second electrodes comprises a laminar two-dimensional semimetal, and
wherein said at least one of said first and second electrodes, comprising said laminar two-dimensional semimetal, is configured to reduce a leak current through said dielectric film.

3. A capacitor comprising:
first and second electrodes, and
a dielectric film between the first and second electrodes,
wherein at least one of said first and second electrodes comprises a laminar two-dimensional semiconductor, and
wherein said at least one of said first and second electrodes, comprising said laminar two-dimensional semiconductor, is configured to reduce a leak current through said dielectric film.

4. A capacitor comprising:
first and second electrodes, and
a dielectric film between the first and second electrodes,
wherein at least one of said first and second electrodes comprises a metal film having a two-dimensional electrical conductivity due to a quantum confinement of electrical charges, and
wherein said at least one of said first and second electrodes, comprising said metal film, is configured to reduce a leak current through said dielectric film.

5. A capacitor comprising:
first and second electrodes, and
a dielectric film between the first and second electrodes,
wherein at least one of said first and second electrodes comprises a laminar two-dimensional semimetal comprising a transition metal chalcogen compound.

6. A capacitor comprising:
first and second electrodes, and
a dielectric film between the first and second electrodes,
wherein at least one of said first and second electrodes comprises a laminar two-dimensional semiconductor, and
a carrier density of said laminar two-dimensional semiconductor is in a range of $1 \times 10^{20}$ to $1 \times 10^{21}$ cm$^{-3}$.

7. A capacitor comprising:
first and second electrodes, and
a dielectric film between the first and second electrodes,
wherein at least one of said first and second electrodes comprises a laminate film including at least one metal film having a two-dimensional electrical conductivity due to a quantum confinement of electrical charges and at least one insulator film, wherein said metal film and said insulator film are positioned alternatively.

8. The capacitor according to claim 7, wherein said at least one of said first and second electrodes, comprising said metal film and said insulator film, is configured to reduce a leak current through said dielectric film.

9. A capacitor comprising:
first and second electrodes, and
a dielectric film between the first and second electrodes,
wherein at least one of said first and second electrodes comprises a laminate film including at least one metal film having a two-dimensional electrical conductivity due to a quantum confinement of electrical charges and at least one semiconductor film having a two-dimensional electrical conductivity due to a quantum confinement of electrical charges, wherein said metal film and said semiconductor film are positioned alternatively.

10. A capacitor comprising:
first and second electrodes, and
a dielectric film between the first and second electrodes,
wherein at least one of said first and second electrodes comprises a laminate film including at least one semimetal film having a two-dimensional electrical conductivity due to a quantum confinement of electrical charges and at least one semiconductor film having a two-dimensional electrical conductivity due to a quantum confinement of electrical charges, wherein said semimetal film and said semiconductor film are positioned alternatively.

11. A capacitor comprising:
first and second electrodes, and
a dielectric film between the first and second electrodes,
wherein at least one of said first and second electrodes comprises a laminate film including at least one semimetal film having a two-dimensional electrical conductivity due to a quantum confinement of electrical charges and at least one insulator film, wherein said semimetal film and said insulator film are positioned alternatively.

12. The capacitor according to claim 11, wherein said at least one of said first and second electrodes, comprising said semimetal film and said insulator film, is configured to reduce a leak current through said dielectric film.

13. A capacitor comprising;
first and second electrodes, and
a dielectric film between the first and second electrodes,
wherein at least one of said first and second electrodes comprises a semimetal film having a two-dimensional electrical conductivity due to a quantum confinement of electrical charges.

14. The capacitor according to claim 13, wherein said at least one of said first and second electrodes, comprising said semimetal film, is configured to reduce a leak current through said dielectric film.

15. The capacitor of claim 13, wherein the semimetal film comprises a transition metal chalcogen compound.

16. The capacitor of claim 13, wherein the semimetal film comprises graphite.

17. A capacitor comprising:
first and second electrodes, and
a dielectric film between the first and second electrodes,
wherein at least one of said first and second electrodes comprises a semiconductor film having a two-dimensional electrical conductivity due to a quantum confinement of electrical charges.

18. The capacitor according to claim 17, wherein said at least one of said first and second electrodes, comprising said semiconductor film, is configured to reduce a leak current through said dielectric film.

19. The capacitor of claim 17, wherein the semiconductor film comprises a material based on a bismuth system superconductor (2212) phase.

20. The capacitor of claim 17, wherein a carrier density of said semiconductor film is in a range of $1 \times 10^{20}$ to $1 \times 10^{21}$ $cm^{-3}$.

21. The capacitor of claim 13, or 17, wherein the thickness of the film is in a range of 0.5 nm–5 nm.

22. The capacitor of any one of claims 13, 5, 19, 6, 7, 11, 9, 10, 15 or 20, wherein said dielectric film is a laminar dielectric film.

* * * * *